(12) United States Patent
Lv

(10) Patent No.: US 10,707,284 B2
(45) Date of Patent: Jul. 7, 2020

(54) ORGANIC LIGHT-EMITTING DISPLAY PANEL AND MANUFACTURING METHOD THEREOF

(71) Applicant: Wuhan China Star Optoelectronics Semiconductor Display Technology Co., Ltd., Wuhan (CN)

(72) Inventor: Linhong Lv, Shenzhen (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 16/109,804

(22) Filed: Aug. 23, 2018

(65) Prior Publication Data

US 2019/0326369 A1    Oct. 24, 2019

Related U.S. Application Data

(63) Continuation of application No. PCT/CN2018/087841, filed on May 22, 2018.

(30) Foreign Application Priority Data

Apr. 19, 2018  (CN) .......................... 2018 1 0355798

(51) Int. Cl.
  *H01L 27/32*   (2006.01)
  *H01L 51/52*   (2006.01)
  (Continued)

(52) U.S. Cl.
  CPC ...... *H01L 27/3246* (2013.01); *H01L 27/3276* (2013.01); *H01L 27/3283* (2013.01); *H01L 27/3288* (2013.01); *H01L 51/0023* (2013.01); *H01L 51/5209* (2013.01); *H01L 51/5253* (2013.01); *H01L 51/56* (2013.01); *H01L 2227/323* (2013.01)

(58) Field of Classification Search
  CPC ............. H01L 27/3246; H01L 51/5209; H01L 27/3283; H01L 51/0023
  See application file for complete search history.

(56) References Cited

U.S. PATENT DOCUMENTS

2013/0207085 A1   8/2013  Im et al.
2014/0353597 A1   12/2014 Ahn
(Continued)

*Primary Examiner* — Jay C Chang
*Assistant Examiner* — Mikka Liu

(57) ABSTRACT

The present disclosure provides an organic light-emitting display panel and a manufacturing method thereof. The organic light-emitting display panel may include: a first anode layer including a number of first anodes; a pixel definition layer defining a number of pixel regions, wherein one of a first opening and a second opening is defined in each of the pixel regions, the second opening has a depth smaller than that of first opening, an inclination angle is formed between the side wall and the bottom surface, and the inclination angle is larger than 90° and smaller than 180°; a second anode layer arranged in second opening; an organic light-emitting layer arranged in the first opening and the second opening. Accordingly, the resolution of the organic light-emitting display panel is improved.

17 Claims, 4 Drawing Sheets

(51) Int. Cl.
*H01L 51/00* (2006.01)
*H01L 51/56* (2006.01)

(56) References Cited

U.S. PATENT DOCUMENTS

| | | | |
|---|---|---|---|
| 2015/0053948 A1* | 2/2015 | Matsushima | H01L 51/0004 257/40 |
| 2016/0056214 A1* | 2/2016 | Pyo | H01L 27/3211 257/40 |
| 2016/0276615 A1 | 9/2016 | Kitabayashi | |
| 2017/0200778 A1* | 7/2017 | Jeon | H01L 27/3213 |
| 2019/0103573 A1* | 4/2019 | Hamada | H01L 51/5012 |
| 2019/0198816 A1* | 6/2019 | Park | H01L 51/5265 |

\* cited by examiner

ORGANIC LIGHT-EMITTING DISPLAY PANEL AND MANUFACTURING METHOD THEREOF

CROSS-REFERENCE TO RELATED APPLICATIONS

The present application is a continuation-application of International (PCT) Patent Application No. PCT/CN2018/087841 filed May 22, 2018, which claims foreign priority of Chinese Patent Application No. 201810355798.X, filed on Apr. 19, 2018 in the State Intellectual Property Office of China, the entire contents of which are hereby incorporated by reference.

TECHNICAL FIELD

The present disclosure relates to the field of display technologies, and in particular, to an organic light-emitting display panel and a manufacturing method thereof.

BACKGROUND

Among display devices, organic light-emitting display devices have become one of the most competitive technologies in a new generation of display devices because of their wide color gamut, high contrast, energy saving, foldability, etc. With continuous development of information society, people are increasingly demanding resolution and display accuracy of the display devices. In particular, a head-mounted displayer including an organic light-emitting display device has a relatively short distance from user's eye to its focus. Therefore, if the resolution of the organic light-emitting display device is low, a distance between two adjacent display regions will be too large, which makes user eyes easily see non-display regions as panes and hereby affects the effect of use. Therefore, how to improve the resolution of the display device becomes a technical problem that needs to be solved.

SUMMARY

An organic light-emitting display panel and a manufacturing method thereof are provided in the present disclosure, in order to solve the technical problem that the resolution of a conventional organic light-emitting display panel is low.

In order to solve the technical problem above, a technical solution adopted in the present disclosure is to provide an organic light-emitting display panel. The organic light-emitting display panel includes a first anode layer, a pixel definition layer, a second anode layer and an organic light-emitting layer. The first anode layer includes a plurality of patterned first anodes. The pixel definition layer is arranged on the first anode layer, and defines a plurality of pixel regions. One of a first opening and a second opening is defined in each of the pixel regions, each of the pixel regions comprises a side wall and a bottom wall in each first opening and each second opening, an inclination angle is formed between the side wall and the bottom surface the inclination angle is larger than 90° and smaller than 180°, the first opening is configured to correspond to the first anode and expose the first anode, and the second opening has a depth smaller than that of first opening. The second anode layer includes a plurality of patterned second anodes, wherein the second anode is arranged in the second opening. The organic light-emitting layer is arranged in the first opening and the second opening. A light-emitting area proportion in the first opening is smaller than a light-emitting area proportion in the second opening, wherein the light-emitting area proportion is a percentage of a light-emitting area of a pixel region to an area of the pixel region, and the light-emitting area is a contact area between the organic light-emitting layer and the first anode or the second anode in each of the pixel regions.

In order to solve the technical problem above, another technical solution adopted in the present disclosure is to provide an organic light-emitting display panel. The organic light-emitting display panel includes: a first anode layer, including a plurality of patterned first anodes; a pixel definition layer, arranged on the first anode layer, wherein the pixel definition layer defines at least a first pixel region and a second pixel region adjacent to the first pixel region, a first opening is defined in the first pixel region, a second opening is defined in the second pixel region, an obtuse angle is formed between a side wall and a bottom surface in the first opening and an obtuse angle is formed between a side wall and a bottom surface in the second opening, the second opening has a depth smaller than that of first opening such that the bottom surface in the second opening is higher than the bottom surface of the first opening; a second anode layer, including a plurality of patterned second anodes, wherein the second anode is arranged in the second opening; an organic light-emitting layer, arranged in the first opening and the second opening, wherein the organic light-emitting layer in the first opening contacts the first anode, and the organic light-emitting layer in the second opening is disposed on the second anode and contacts the second anode.

In order to solve the technical problem above, a further technical solution adopted in the present disclosure is to provide a manufacturing method of an organic light-emitting display panel. The manufacturing method includes: forming a first anode layer, wherein the first anode layer includes a plurality of first anodes; forming a pixel definition layer on the first anode layer, and defining a plurality of pixel regions on the pixel definition layer, wherein one of a first opening and a second opening is defined in each of the pixel regions, each of the pixel regions includes a side wall and a bottom surface in each first opening and each second opening, an inclination angle is formed between the side wall and the bottom, the inclination angle is larger than 90° and smaller than 180°, the first opening is configured to correspond to the first anode and expose the first anode, and the second opening has a depth smaller than that of first opening; forming a second anode in the second opening; forming an organic light-emitting layer in the first opening and the second opening, wherein a light-emitting area proportion in the first opening is smaller than a light-emitting area proportion in the second opening, the light-emitting area proportion is a percentage of a light-emitting area of a pixel region to an area of the pixel region, and the light-emitting area is a contact area between the organic light-emitting layer and the first anode or the second anode in each of the pixel regions.

Embodiments of the present disclosure may have the following advantages: by forming the first opening and the second opening with different depths (i.e., the depth of the second opening is smaller than that of the first opening) in the pixel regions of the pixel definition layer and forming the inclination angle between the side wall and the bottom surface in the first opening and the inclination angle between the side wall and the bottom surface in the second opening (wherein the inclination angles are larger than 90° and smaller than 180°), the light-emitting area proportion in the second opening is larger than the light-emitting area proportion in the first opening; wherein the light-emitting area proportion is the percentage of the light-emitting area of the pixel region to the area of the pixel region, and the light-emitting area is the contact area between the organic light-emitting layer and the first anode or the second anode in each of the pixel regions. Therefore, by increasing light-emitting area proportion in the pixel region of the second opening, the light-emitting area of the entire display panel is increased. Accordingly, the resolution of the organic light-emitting display panel is improved.

BRIEF DESCRIPTION OF THE DRAWINGS

In order to make the technical solution of embodiments of the present disclosure more clearly, drawings used for the description of the embodiments will be briefly described. Apparently, the drawings described above are only some exemplary embodiments of the present disclosure. One skilled in the art may acquire other drawings based on these drawings without any inventive work. In the drawings.

DETAILED DESCRIPTION

Figure 1:
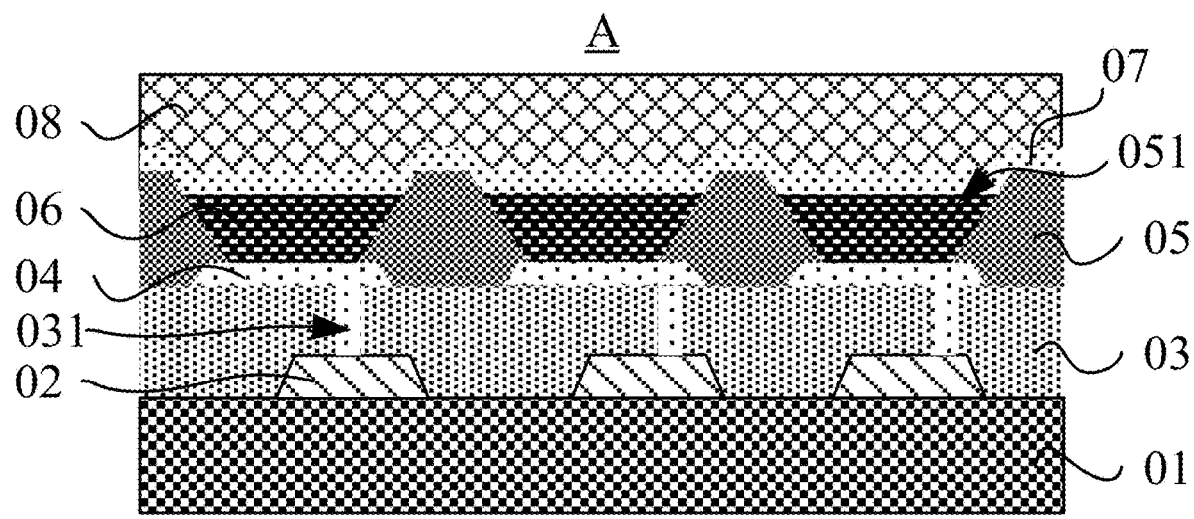
FIG. 1 is a schematic sectional view of an organic light-emitting display panel of related art.

The technical solutions of embodiments of the present disclosure will be described more clearly and completely with reference to the accompanying drawings. Apparently, the embodiments described here only are some exemplary embodiments, not all the embodiments. Based on the embodiments described in the present disclosure, one skilled in the art may acquire all other embodiments without any creative work. All these shall be covered within the protection scope of the present disclosure.

The terms "first" and "second" in the present disclosure are used herein for purposes of description and are not intended to indicate or imply relative importance or to imply the number of indicated technical features. Thus, the feature defined with "first" and "second" may explicitly or implicitly include at least one such feature. In the description of the present disclosure, the term "a plurality of" means at least two, such as two, three, etc., unless specified otherwise. All directional indications (such as up, down, left, right, front, rear, etc.) in the embodiments of the present disclosure are only used to explain the relative positional relationship among the components in a specific posture (as shown in the drawings), sports situations, etc. If the specific posture changes, the directional indication changes accordingly. Further, the terms "include" and "have" and any variants thereof are intended to cover non-exclusive inclusions. For example, a process, method, system, product, or apparatus that includes a series of steps or components is not limited to the listed steps or components, but may optionally include steps or components that are not listed, or alternatively include other steps or components inherent to the process, method, product, or apparatus.

References herein to "embodiment" mean that a particular feature, structure, or characteristic described in connection with an embodiment may be included in at least one embodiment of the present disclosure. The appearances of such phrases in various places of the specification are not necessarily referring to the same embodiment, nor mean separate or alternative embodiments mutually exclusive of other embodiments. It will be understood by those skilled in the art, both explicitly and implicitly, that an embodiment described herein may be combined with other embodiments.

Referring to FIG. 1, a schematic sectional view of an organic light-emitting display panel A of the related art is shown.

The organic light-emitting display panel A may include: a metal layer 02, a planarization layer 03, an anode layer 04, a pixel definition layer 05, an organic light-emitting layer 06, a cathode layer 07 and an encapsulation layer 08, which may be sequentially formed on the a substrate 01.

A plurality of through holes 031 may be defined in the planarization layer 03. The anode layer 04 arranged on the planarization layer 03 may connect with the metal layer 02 via the through hole 031.

At positions on the pixel definition layer 05 corresponding to the anode layer 04, a plurality of openings 051 extending to the anode layer 04 may be formed by etching. Because the pixel definition layer 05 may be etched by etching liquid from the outside to the inside, an inclination angle may be formed between a side wall and a bottom surface in the opening 051 of the pixel definition layer 05. The bottom surface may overlap with the top surface of the anode layer 04. Thus, an inverted trapezoidal section may be formed. The organic light-emitting layer 06 may be arranged in the regions of the openings 051 of the pixel definition layer 05.

Figure 2:
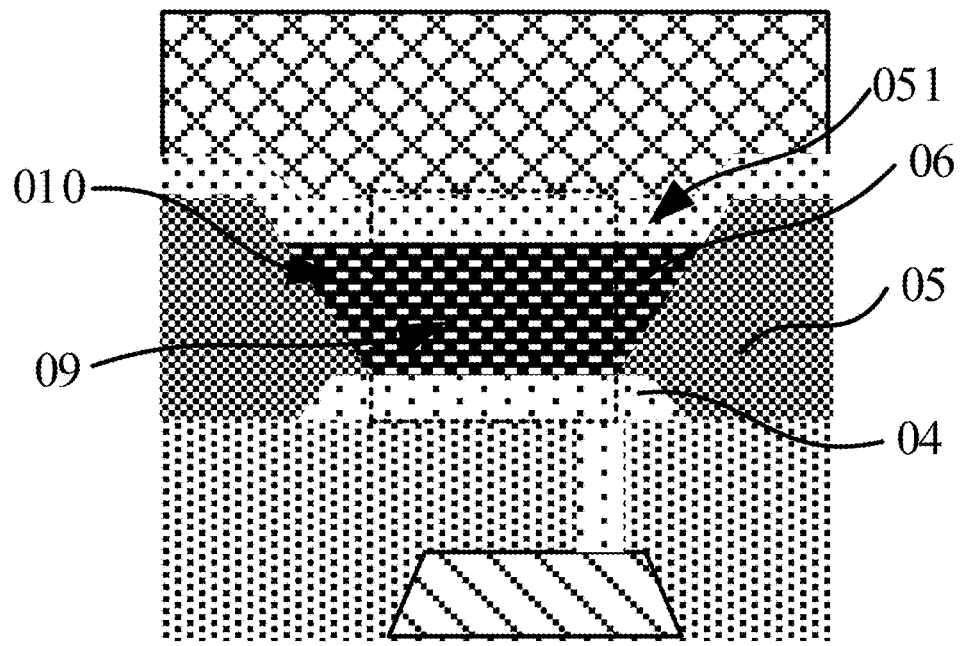
FIG. 2 is a schematic enlarged view of a single pixel region shown in FIG. 1.

Referring to FIG. 2, a schematic enlarged view of a single pixel region in FIG. 1 is shown.

In the single pixel region, because the inclination angle θ may be formed between the side wall and the bottom surface in the opening 051 of the pixel definition layer 05, a light-emitting region 09 may be only a region corresponding to an area where the organic light-emitting layer 06 contacts the anode layer 04. The rest of the organic light-emitting layer 06 may be a non-luminous region 010.

Figure 3:
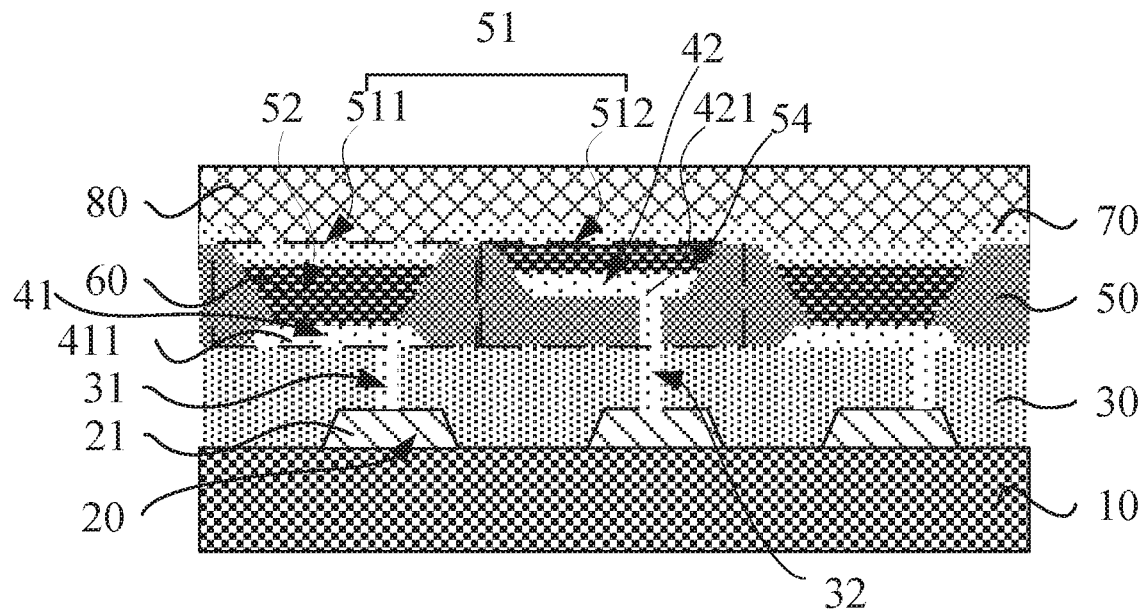
FIG. 3 is a schematic sectional view of an organic light-emitting display panel according to a first embodiment of the present disclosure.
Figure 4:
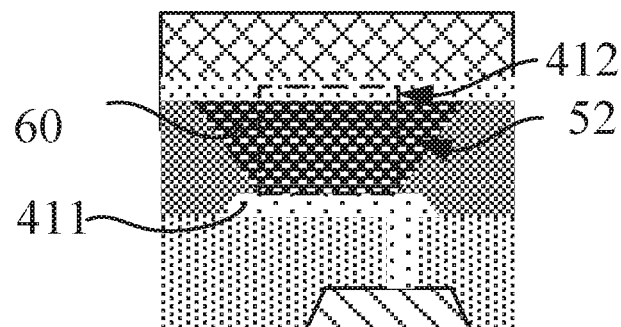
FIG. 4 is a schematic view of two pixel regions according to the first embodiment of the present disclosure, for comparing with the single pixel region of the conventional organic light-emitting display panel.
Figure 4:
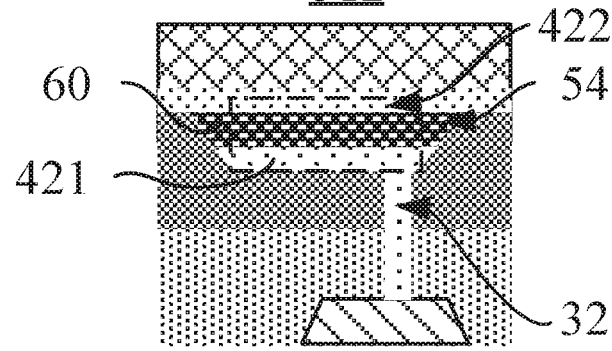

Referring to FIGS. 3 and 4, FIG. 3 is a schematic sectional view of an organic light-emitting display panel according to a first embodiment of the present disclosure; and, FIG. 4 is a schematic view of two pixel regions according to the first embodiment of the present disclosure, for comparing with the single pixel region of the organic light-emitting display panel of related art.

In this embodiment, the organic light-emitting display panel B may include: a substrate 10, a metal layer 20, a planarization layer 30, a first anode layer 41, a pixel definition layer 50, a second anode layer 42, an organic light-emitting layer 60, a cathode layer 70, and an encapsulation layer 80.

The substrate 10 may include a base substrate, a polysilicon layer, an inorganic insulating layer, and a gate layer. The base substrate may be a transparent material. Specifically, the base substrate may include, but not limit to, a glass, a ceramic substrate, or a transparent plastic, etc.

The metal layer 20 may be arranged on the substrate 10 and may be composed of a plurality of metal wires 21. A manufacturing method of the metal layer 20 may include: providing a complete metal layer on the substrate 10; exposing, developing and etching the complete metal layer via a mask with a specific electrode pattern to form a plurality of patterned metal wires 21. The manufacturing method of the metal layer 20 may belong to well-known technology for those skilled in the art, and may refer to the preparation method in the prior art, which is not specifically limited in the present disclosure.

The planarization layer 30 may be arranged on the metal layer 20, and a plurality of first through holes 31 may be defined in the planarization layer 30.

The first anode layer 41 may be arranged on the planarization layer 30, and may include a plurality of patterned first anodes 411. The first anode 411 may connect with the metal wire 21 via the first through hole 31.

The pixel definition layer 50 may be arranged on the first anode layer 41, and a plurality of pixel regions 51 may be defined on the pixel definition layer 50. A first opening 52 or a second opening 54 may be defined in each of the pixel regions 51. An inclination angle θ may be formed between a side wall and a bottom surface in the first opening 52, and an inclination angle θ may be formed between a side wall and a bottom surface in the second opening 54. The bottom surface in the first opening 52 may overlap with the top surface of the first anode 411. The first opening 52 may be defined in the pixel region 51 corresponding to the first anode 411, and expose part of the first anode 411. The second opening 54 may be defined in the pixel region 51 where the first opening 52 is not provided, and the depth of the second opening 54 may be smaller than the depth of the first opening 52. A second through hole 32 may be defined at the bottom in the second opening 54 and extend to the metal layer 20.

The first opening 52 and the second opening 54 may be formed by applying an etching liquid on the pixel definition layer 50. Since the pixel definition layer 50 may be gradually etched by the etching liquid inward from the outermost layer, the diameters of the first opening 52 and the second opening 54 may be decreased in the depth direction. Therefore, the inclination angles θ may be formed between the side walls and bottom surfaces in the first opening 52 and the second opening 54, wherein the inclination angles may be larger than 90° and smaller than 180°.

The second anode layer 42 may include a plurality of patterned second anodes 421. The second anode 421 may be arranged in the second opening 54, and connect with the metal wire 21 via the second through hole 32.

The organic light-emitting layer 60 may be arranged in the first opening 52 and the second opening 54. A light-emitting area proportion of the organic light-emitting layer 60 in the first opening 52 may be smaller than a light-emitting area proportion of the organic light-emitting layer 60 in the second opening 54, wherein the light-emitting area proportion may be a percentage of a light-emitting area of a pixel region 51 to an area of the pixel region 51, and the light-emitting area may be a contact area between the organic light-emitting layer 60 and the first anode 411 or the second anode 421 in each of the pixel regions 51.

The cathode layer 70 may be completely covered on the organic light-emitting layer 60 and the pixel definition layer 50. The encapsulation layer 80 may be arranged on the cathode layer 70, for packaging and finally forming the organic light-emitting display panel B.

In this embodiment, the thickness of the organic light-emitting layer 60 in the first opening 52 and the thickness of the organic light-emitting layer 60 in the second opening 54 may be different. However, it should be ensured that the depths of the first opening 52 and the second opening 54 are larger than the minimum thickness of the organic light-emitting layer 60 required for normal light-emission. Thus, after the depth of the second opening 54 is reduced, the organic light-emitting layer 60 in the second opening 54 may emit light normally and hereby achieve the normal function of the organic light-emitting layer 60.

Further, in this embodiment, the first opening 52 and the second opening 54 may be alternately disposed within at least part of the pixel regions 51. Specifically, when the first anode layer 41 is disposed on the planarization layer 30, the first anodes 411 may be disposed within at least part of the pixel regions 51 at interval of one metal line 21. The first openings 52 may be formed in the pixel regions 51 corresponding to the first anodes 411, so the pixel regions 51 provided with the first openings 52 may be the same as the pixel regions 51 provided with the first anodes 411. This may cause the first openings 52 to be disposed in at least part of the pixel regions 51 at interval of one pixel area 51. The second openings 54 may be disposed in the pixel regions 51 where the first openings 52 are not provided, causing the first openings 52 and the second openings 54 to be alternately arranged in at least part of the pixel regions 51.

Referring to FIG. 2, assuming that a single pixel region is a square with a side length of D, the inclination angle between the side wall and the bottom surface in the opening 051 is θ, and the depth of the opening 051 is L, it may be calculated that the area of the single pixel region is:

$$S=D^2 \quad (1).$$

The organic light-emitting layer 06 contacts with the anode layer 04, so the light-emitting area S1 is:

$$S1=[D-2L\tan(\theta-90°)]^2 \quad (2).$$

A light-emitting area proportion of the organic light-emitting layer 06 is:

$$\gamma = S1/S = \frac{[D-2L\tan(\theta - 90°)]^2}{D^2}. \quad (3)$$

From this, it may be seen that the light-emitting area proportion of the organic light-emitting layer 06 relates to the area of the single pixel region, the depth of the opening 051, and the inclination angle θ.

Referring to FIGS. 3 and 4, in this embodiment, the area of the first pixel region 511 where the first opening 52 is disposed may be equal to the area of the second pixel region 512 where the second opening 54 is disposed, and the inclination angle between the side wall and the bottom surface in the first opening 52 may be equal to the inclination angle between the side wall and the bottom surface in the second opening 54, i.e., $D_1=D_2$, and $\theta_1=\theta_2$. The depth of the second opening 54 may be smaller than the depth of the first opening 52, i.e., $L_1>L_2$. According to the equation (2), it may be seen that the light-emitting area 412 in the first pixel region 511 may be smaller than the light-emitting area 422 in the second pixel region 512. According to the equation (3), it may be obtained that the light-emitting area proportion of the organic light-emitting layer 60 in the first opening 52 may be smaller than the light-emitting area proportion of the organic light-emitting layer 60 in the second opening 54, i.e., $\gamma_1 \leq \gamma_2$.

From this, it may be seen that in the pixel regions 51 having the same areas, since the depth of the second opening 54 is smaller than the depth of the first opening 52, the light-emitting area 422 of the organic light-emitting layer 60 provided in the second opening 54 may be larger than the light-emitting area 412 of the organic light-emitting layer 60 provided in the first opening 52. Thus, the non-luminous area between the first pixel region 511 provided in the first opening 52 and the adjacent second pixel region 512 provided in the second opening 54 may be reduced, and the resolution may be increased.

In another embodiment, the area of the first pixel region 511 where the first opening 52 is disposed may be equal to the area of the second pixel region 512 where the second opening 54 is disposed, the depth of the second opening 54 may be smaller than the depth of the first opening 52, and the inclination angle between the side wall and the bottom surface in the second opening 54 may be smaller than the inclination angle between the side wall and the bottom surface in the first opening 52. That is to say, $L_1 > L_2$, and $\theta_1 > \theta_2$. Then, it may be seen that $\gamma_1 < \gamma_2$ according the following equation:

$$\gamma = S1/S = \frac{[D - 2L\tan(\theta - 90°)]^2}{D^2}.$$

Therefore, it may be seen that, when the area of the first pixel region 511 where the first opening 52 is disposed and the area of the second pixel region 512 where the second opening 54 is disposed are equal, and the depth of the second opening 54 is smaller than the depth of the first opening 52, the smaller the inclination angle θ between the side wall and the bottom surface, the higher the light-emitting area proportion of the organic light-emitting layer 60, and the higher the resolution of the organic light-emitting display panel B.

Figure 5:
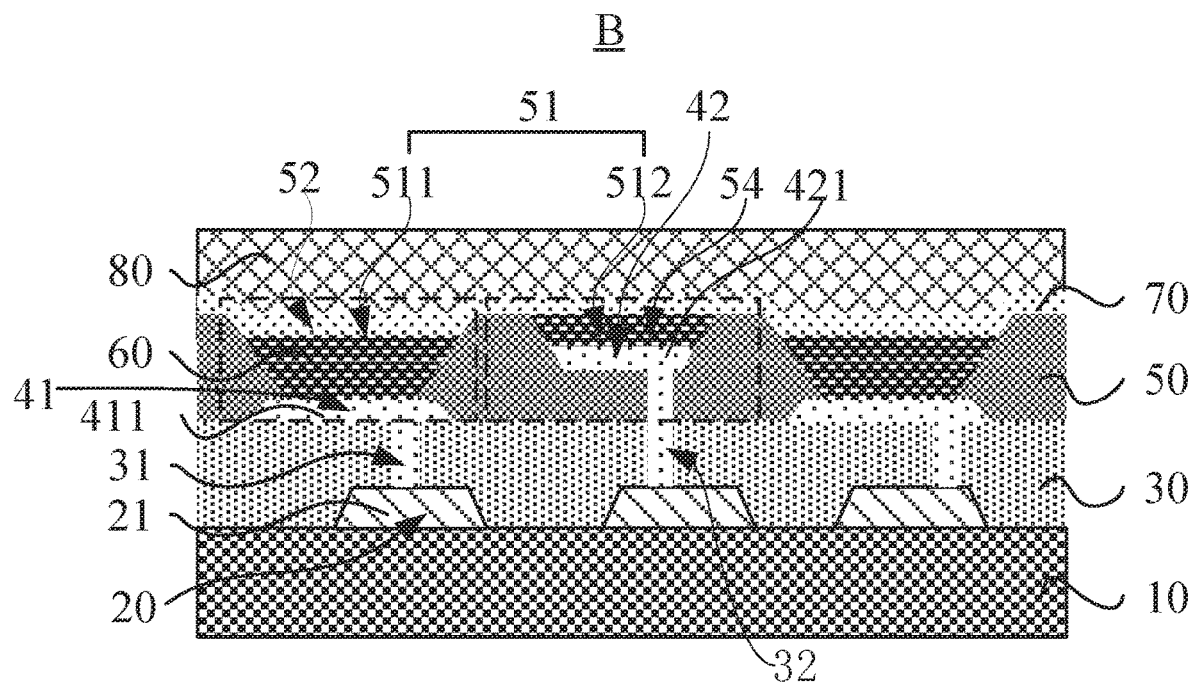
FIG. 5 is a schematic sectional view of an organic light-emitting display panel according to a second embodiment of the present disclosure.
Figure 6:
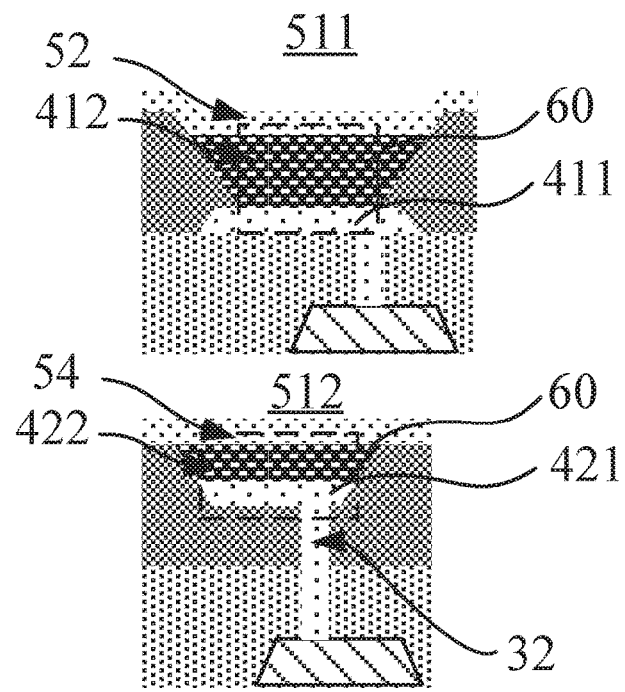
FIG. 6 is a schematic view of two pixel regions according to the second embodiment of the present disclosure, for comparing with the single pixel region of the conventional organic light-emitting display panel.

Referring to FIGS. 5 and 6, FIG. 5 is a schematic sectional view of an organic light-emitting display panel according to a second embodiment of the present disclosure; and, FIG. 6 is a schematic view of two pixel regions according to the second embodiment of the present disclosure, for comparing with the single pixel region of the conventional organic light-emitting display panel.

In this embodiment, a contact area between the organic light-emitting layer 60 in the first opening 52 and the first anode 411 may be equal to a contact area between the organic light-emitting layer 60 in the second opening 54 and the second anode 421.

Specifically, because the contact area between the organic light-emitting layer 60 and the first anode 411 and the contact area between the organic light-emitting layer 60 and the second anode 421 may be equal, the light-emitting areas may be equal.

As noted above, the light-emitting area proportion of the organic light-emitting layer may be defined according to the below equation:

$$\gamma = S1/S = \frac{[D - 2L\tan(\theta - 90°)]^2}{D^2}.$$

Based on this equation, when the inclination angle θ between the side wall and the bottom surface in the first opening 52 is equal to the inclination angle θ between the side wall and the bottom surface in the second opening 54, and the depth of the first opening 52 is larger than the depth of the second opening 54, the area of the second pixel region 512 must be reduced in order to ensure that the light-emitting area proportion of the organic light-emitting layer 60 in the second opening 54 is higher than the light-emitting area proportion of the organic light-emitting layer 60 in the first opening 52.

Therefore, in this embodiment, it may be seen that when the depth of the second opening 54 is smaller than the depth of the first opening 52 and the light-emitting areas of the pixel regions 51 are equal, a spacing between adjacent pixel areas 51 may be reduced by disposing the second pixel region 512 having an area smaller than that of the first pixel region 511. Accordingly, a distance between adjacent pixel points may be shortened, and resolution of the organic light-emitting display panel B may be improved.

The above mentioned embodiments may have the following advantages: by forming the first opening 52 and the second opening 54 with different depths (i.e., the depth of the second opening 54 may be smaller than that of the first opening 52) in the pixel regions 51 of the pixel definition layer 50 and forming the inclination angle between the side wall and the bottom surface in the first opening 52 and the inclination angle between the side wall and the bottom surface in the second opening 54 (wherein the inclination angles are larger than 90° and smaller than 180°), the light-emitting area proportion in the second opening 54 may be larger than the light-emitting area proportion in the first opening 52. The light-emitting area proportion may be the percentage of the contact area between the organic light-emitting layer 60 in each pixel region 51 and the first anode 411 (or the second anode 421) to the area of the pixel region 51. Therefore, by increasing light-emitting area proportion in the pixel region 51 of the second opening 54, the light-emitting area of the entire display panel B may be increased. Accordingly, the resolution of the organic light-emitting display panel B may be improved.

Figure 7:
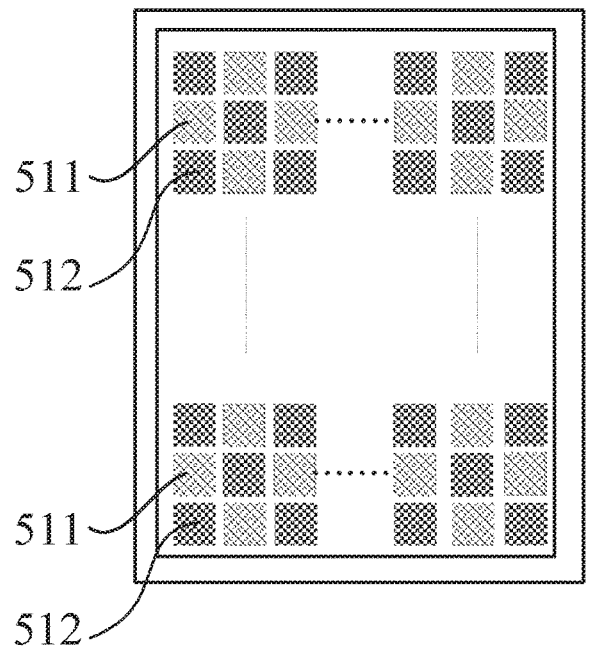
FIG. 7 is a schematic view of an overall structure of an organic light-emitting display panel according to an embodiment of the present disclosure.

Referring to FIG. 7, a schematic view of an overall structure of an organic light-emitting display panel according to an embodiment of the present disclosure is shown.

In this embodiment, the pixel regions may be arranged, but not limited to, in an array structure as shown in FIG. 7 or in a diamond structure.

Figure 8:
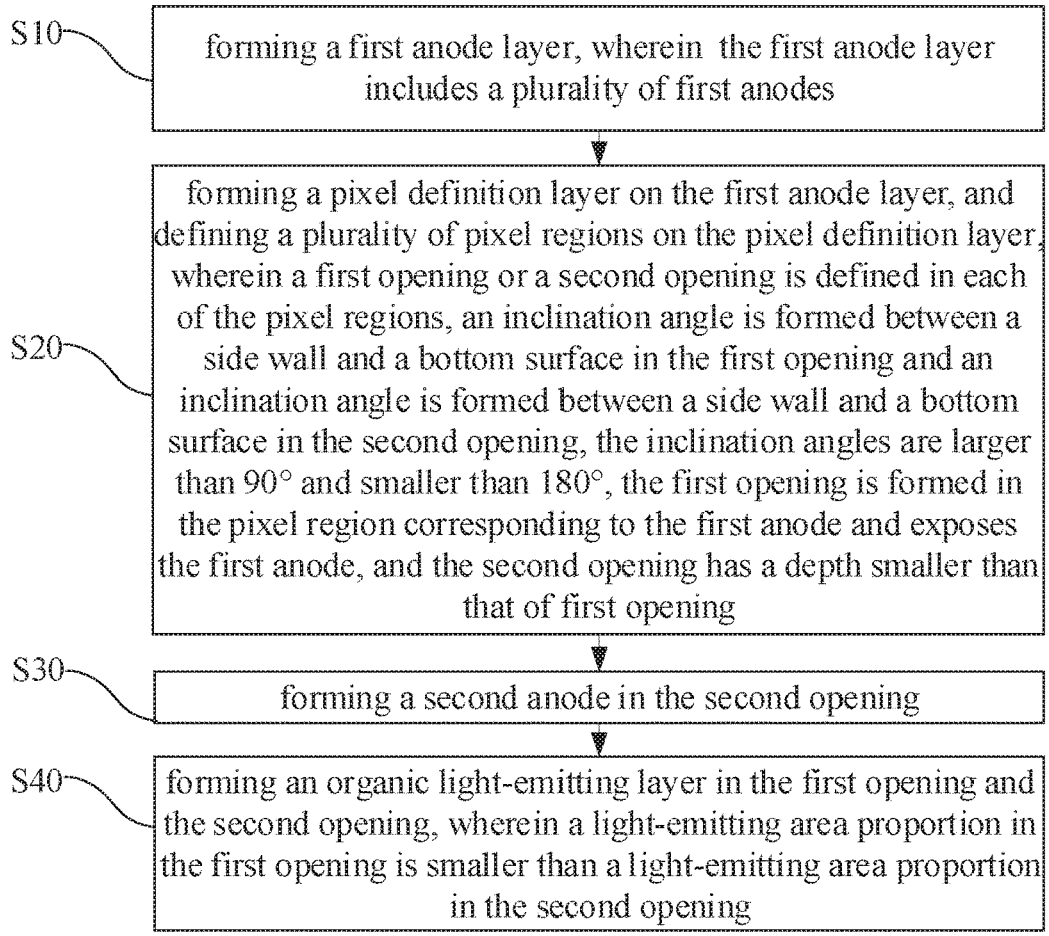
FIG. 8 is a schematic flowchart of a manufacturing method of an organic light-emitting display panel according to an embodiment of the present disclosure.

The present disclosure also provides a manufacturing method of the organic light-emitting display panel B. Referring to FIG. 8, FIG. 8 is a schematic flowchart of a manufacturing method of the organic light-emitting display panel according to an embodiment of the present disclosure. The manufacturing method may be described below referring to FIGS. 2-7.

At block S10: the first anode layer 41 may be formed, and the first anode layer 41 may include a plurality of first anodes 411.

The material of the first anode layer 41 may be a pure metal such as copper, silver, aluminum, etc., or an alloy made of copper and one or more of iron, silver, zinc, nickel, aluminum, magnesium, etc.

The first anode layer 41 including the plurality of first anodes 411 may be formed by exposing, developing and etching a complete anode layer via a mask with a specific electrode pattern.

At block S20: the pixel definition layer 50 may be formed on the first anode layer 41, and the plurality of pixel regions 51 may be defined on the pixel definition layer 50. The first opening 52 or the second opening 54 may be formed in each of the pixel regions 51. The inclination angle larger than 90° and smaller than 180° may be formed between the side wall and the bottom surface in the first opening 52, and the inclination angle larger than 90° and smaller than 180° may be formed between the side wall and the bottom surface in the second opening 54. The first opening 52 may be formed in the pixel region 51 corresponding to the first anode 411, and expose part of the first anode 411. The depth of the second opening 54 may be smaller than the depth of the first opening 52.

A method for forming the first opening 52 or the second opening 54 in the pixel region 51 of the pixel definition layer 50 may include: forming the first opening 52 in the pixel region 51 corresponding to the first anode 411 by etching, wherein the first opening 52 may extend to the first anode 411 and expose the first anode 411; forming the second opening 54 between the pixel regions 51 of at least some adjacent first openings 52 by etching, wherein the depth of the second opening 54 may be smaller than the depth of the first opening 52.

Further, the second opening 54 having a smaller depth than the first opening 52 may be obtained by controlling the etching time of the first opening 52 to be greater than the etching time of the second opening 54. In other embodiments, the first opening 52 and the second opening 54 may also be formed by other implementation manners. However, it should be ensured that the sidewall and the bottom surface in the first opening 52 form the inclination angle, and the sidewall and the bottom surface in the second opening 54 form the inclination angle, and the inclination angles are larger than 90° and smaller than 180°.

At block S30: the second anode 421 may be formed in the second opening 54.

The material and the property of the second anode 421 may be completely the same with those of the first anode 411, and will not be repeated here.

At block S40: the organic light-emitting layer 60 may be formed in the first opening 52 and the second opening 54, and the light-emitting area proportion of the organic light-emitting layer 60 in the first opening 52 may be smaller than the light-emitting area proportion of the organic light-emitting layer 60 in the second opening 54, wherein the light-emitting area proportion may be the percentage of the light-emitting area of the pixel region 51 to the area of the pixel region 51, and the light-emitting area may be the contact area between the organic light-emitting layer 60 and the first anode 411 or the second anode 421 in each of the pixel regions 51.

The organic light-emitting layer 60 may be made of an organic photoresist material. The regions where the organic light-emitting layer 60 contacts with the first anodes 411 and the second anodes 421 may be display regions, and the non-contact regions may be non-display regions. In this embodiment, the first pixel region 511 with the first opening 52 and the second pixel region 512 with the second opening 54 have the same area, and the inclination angle between the side wall and the bottom surface in the first opening 52 may be equal to the inclination angle between the side wall and the bottom surface in the second opening 54, while the depth of the second opening 54 may be smaller than the depth of the first opening 52. This may cause the contact area between the organic light-emitting layer 60 in the first opening 52 and the first anode 411 to be smaller than the contact area between the organic light-emitting layer 60 in the second opening 54 and the second anode 421. Accordingly, the light-emitting area proportion of the first opening 52 may be lower than the light-emitting area proportion of the second opening 54.

In another embodiment, the first pixel region 511 with the first opening 52 and the second pixel region 512 with the second opening 54 may have the same area, and the inclination angle between the side wall and the bottom surface in the first opening 52 may be larger than the inclination angle between the side wall and the bottom surface in the second opening 54, and the depth of the second opening 54 may be smaller than the depth of the first opening 52. This may cause the contact area between the organic light-emitting layer 60 in the first opening 52 and the first anode 411 to be smaller than the contact area between the organic light-emitting layer 60 in the second opening 54 and the second anode 421. Accordingly, the light-emitting area proportion of the first opening 52 may be lower than the light-emitting area proportion of the second opening 54.

In a further embodiment, the contact area between the organic light-emitting layer 60 in the first opening 52 and the first anode 411 may be equal to the contact area between the organic light-emitting layer 60 in the second opening 54 and the second anode 421, while the depth of the second opening 54 may be smaller than the depth of the first opening 52. This may cause the area of the first pixel region 511 where the first opening 52 is disposed to be larger than the area of the second pixel region 512 where the second opening 54 is disposed. Accordingly, the light-emitting area proportion of the first opening 52 may be lower than the light-emitting area proportion of the second opening 54.

The descriptions above are merely the embodiments of the present disclosure, and are not intended to limit the protection scope of the present disclosure. In fact, one skilled in the art may make many equivalents and modifications based on the specification and the drawings of the present disclosure, or directly or indirectly apply the technical solution to other relevant technical field. All these shall all be covered within the protection of the disclosure.

What is claimed is:

1. An organic light-emitting display panel, comprising:
a first anode layer, comprising a plurality of patterned first anodes;
a pixel definition layer, arranged on the first anode layer, wherein the pixel definition layer defines a plurality of pixel regions, one of a first opening and a second opening is defined in each of the pixel regions, each of the pixel regions comprises a side wall and a bottom surface in each first opening and each second opening, an inclination angle is formed between the side wall and the bottom surface, the inclination angle is larger than 90° and smaller than 180°, the first opening is configured to correspond to the first anode and expose the first anode, and the second opening has a depth smaller than that of first opening;
a second anode layer, comprising a plurality of patterned second anodes, wherein the second anode is arranged in the second opening;
an organic light-emitting layer, arranged in the first opening and the second opening, wherein a light-emitting area proportion in the first opening is smaller than a light-emitting area proportion in the second opening, the light-emitting area proportion is a percentage of a light-emitting area of a pixel region to an area of the pixel region, and the light-emitting area is a contact area between the organic light-emitting layer and the first anode or the second anode in each of the pixel regions;

wherein a contact area between the organic light-emitting layer in the first opening and the first anode is equal to a contact area between the organic light-emitting layer in the second opening and the second anode.

2. The organic light-emitting display panel as described in claim 1, wherein at least part of the first openings and the second openings are alternately arranged.

3. The organic light-emitting display panel as described in claim 1, wherein the pixel regions comprise a first pixel region where the first opening is disposed and a second pixel region where the second opening is disposed, an area of the first pixel region is equal to an area of the second pixel region, and the inclination angle between the side wall and the bottom surface in the first opening is equal to the inclination angle between the side wall and the bottom surface in the second opening.

4. The organic light-emitting display panel as described in claim 1, wherein the inclination angle between the side wall and the bottom surface in the first opening is equal to or larger than the inclination angle between the side wall and the bottom surface in the second opening.

5. The organic light-emitting display panel as described in claim 1, wherein the organic light-emitting display panel further comprises:
a substrate;
a metal layer arranged on the substrate, comprising a plurality of patterned metal wires;
a planarization layer arranged on the metal layer, wherein a plurality of first through holes is formed in the planarization layer; the first anode layer being arranged on the planarization layer, and the first anode being electrically connected with the metal wire via the first through hole;
a plurality of second through holes, arranged at the bottom in the second opening and extending to the metal layer; the second anode layer being electrically connected with the metal wire via the second through holes;
a cathode layer, completely covered on the organic light-emitting layer and the pixel definition layer; and
an encapsulation layer, arranged on the cathode layer, for packaging and forming the organic light-emitting display panel.

6. The organic light-emitting display panel as described in claim 1, wherein the pixel regions comprise a first pixel region where the first opening is disposed and a second pixel region where the second opening is disposed, an area of the first pixel region is equal to an area of the second pixel region, and the inclination angle between the side wall and the bottom surface in the first opening is larger than the inclination angle between the side wall and the bottom surface in the second opening.

7. The organic light-emitting display panel as described in claim 1, wherein the plurality of pixel regions is arranged in an array structure.

8. An organic light-emitting display panel, comprising:
a first anode layer, comprising a plurality of patterned first anodes;
a pixel definition layer, arranged on the first anode layer, wherein the pixel definition layer defines at least a first pixel region and a second pixel region adjacent to the first pixel region, a first opening is defined in the first pixel region, a second opening is defined in the second pixel region, an obtuse angle is formed between a side wall and a bottom surface in the first opening and an obtuse angle is formed between a side wall and a bottom surface in the second opening, the second opening has a depth smaller than that of first opening such that the bottom surface in the second opening is higher than the bottom surface of the first opening;
a second anode layer, comprising a plurality of patterned second anodes, wherein the second anode is arranged in the second opening;
an organic light-emitting layer, arranged in the first opening and the second opening, wherein the organic light-emitting layer in the first opening contacts the first anode, and the organic light-emitting layer in the second opening is disposed on the second anode and contacts the second anode;
wherein a contact area between the organic light-emitting layer in the first opening and the first anode is equal to a contact area between the organic light-emitting layer in the second opening and the second anode.

9. The organic light-emitting display panel as described in claim 8, wherein an area of the first pixel region is equal to an area of the second pixel region, and the obtuse angle between the side wall and the bottom surface in the first opening is equal to or larger than the obtuse angle between the side wall and the bottom surface in the second opening.

10. The organic light-emitting display panel as described in claim 8, wherein the obtuse angle between the side wall and the bottom surface in the first opening is equal to the obtuse angle between the side wall and the bottom surface in the second opening.

11. The organic light-emitting display panel as described in claim 8, further comprising:
a substrate;
a metal layer arranged on the substrate, comprising a plurality of patterned metal wires;
a planarization layer arranged on the metal layer, wherein a plurality of first through holes is formed in the planarization layer;
the first anode layer being arranged on the planarization layer, and the first anode being electrically connected with the metal wire via the first through hole;
a plurality of second through holes, arranged at the bottom of the second opening and extending to the metal layer; the second anode layer being electrically connected with the metal wire via the second through holes;
a cathode layer, completely covered on the organic light-emitting layer and the pixel definition layer; and
an encapsulation layer, arranged on the cathode layer, for packaging and forming the organic light-emitting display panel.

12. The organic light-emitting display panel as described in claim 8, wherein the pixel definition layer defines a plurality of pixel regions, and the plurality of pixel regions is arranged in an array structure.

13. A manufacturing method of an organic light-emitting display panel, comprising:
forming a first anode layer, wherein the first anode layer comprises a plurality of first anodes;
forming a pixel definition layer on the first anode layer, and defining a plurality of pixel regions on the pixel definition layer, wherein one of a first opening and a second opening is defined in each of the pixel regions, each of the pixel regions comprises a side wall and a bottom surface in each first opening and each second opening, an inclination angle is formed between the side wall and the bottom surface, the inclination angle is larger than 90° and smaller than 180°, the first opening is configured to correspond to the first anode and expose the first anode, and the second opening has a depth smaller than that of first opening;
forming a second anode in the second opening; and forming an organic light-emitting layer in the first opening and the second opening, wherein a light-emitting area proportion in the first opening is smaller than a light-emitting area proportion in the second opening, the light-emitting area proportion is a percentage of a light-emitting area of a pixel region to an area of the pixel region, and the light-emitting area is a contact area between the organic light-emitting layer and the first anode or the second anode in each of the pixel regions;

wherein a contact area between the organic light-emitting layer in the first opening and the first anode is equal to a contact area between the organic light-emitting layer in the second opening and the second anode.

14. The manufacturing method as described in claim 13, wherein the second opening having a smaller depth than the first opening is formed by controlling the etching time of the first opening to be greater than the etching time of the second opening.

15. The manufacturing method as described in claim 13, wherein the pixel regions comprise a first pixel region where the first opening is disposed and a second pixel region where the second opening is disposed, an area of the first pixel region is equal to an area of the second pixel region, and the inclination angle between the side wall and the bottom surface in the first opening is equal to the inclination angle between the side wall and the bottom surface in the second opening.

16. The manufacturing method as described in claim 13, wherein the pixel regions comprise a first pixel region where the first opening is disposed and a second pixel region where the second opening is disposed, an area of the first pixel region is equal to an area of the second pixel region, and the inclination angle between the side wall and the bottom surface in the first opening is larger than the inclination angle between the side wall and the bottom surface in the second opening.

17. The manufacturing method as described in claim 13, wherein the inclination angle between the side wall and the bottom surface in the first opening is equal to or larger than the inclination angle between the side wall and the bottom surface in the second opening.

\* \* \* \* \*